United States Patent
Klein

(10) Patent No.: US 7,667,534 B2
(45) Date of Patent: Feb. 23, 2010

(54) CONTROL INTERFACE AND PROTOCOL

(75) Inventor: Jonathan Klein, Palo Alto, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 452 days.

(21) Appl. No.: 11/724,786

(22) Filed: Mar. 15, 2007

(65) Prior Publication Data

US 2008/0224765 A1  Sep. 18, 2008

(51) Int. Cl.
  H03K 5/153 (2006.01)
  H03K 9/08 (2006.01)
(52) U.S. Cl. .................. 329/312; 327/77; 327/88; 327/89; 327/97
(58) Field of Classification Search ......... 329/311–314; 327/50, 77–79, 88, 89, 97
  See application file for complete search history.

(56) References Cited

U.S. PATENT DOCUMENTS 5,210,846 A  5/1993 Lee
6,438,178 B1 *  8/2002 Lysdal et al. ............... 375/317
7,053,667 B1  5/2006 Tang
7,068,021 B2  6/2006 Chapuis

OTHER PUBLICATIONS

Datasheet for bq2023 "Single-Wire Advanced Battery Monitor IC for Cellular and PDA Applications," Texas Instruments Incorporated, May 2001, pp. 1-25, Addendum p. 1.

* cited by examiner

Primary Examiner—David Mis
(74) Attorney, Agent, or Firm—Sidley Austin LLP

(57) ABSTRACT

In one embodiment, a method for a control interface includes: receiving a signal conveying bits of information over a single line; and for each bit of information, comparing the proportion of time that the signal on the single line is low versus the proportion of time that the signal on the single line is high for a respective bit period defined from one operative edge of the signal to the next operative edge of the signal in order to determine a logic value for that bit of information.

37 Claims, 3 Drawing Sheets

CONTROL INTERFACE AND PROTOCOL

BACKGROUND

1. Field of Invention

The present invention relates to control operations for electronic devices, and more particularly, to a control interface and protocol.

2. Description of Related Art

Modern electronic devices typically include multiple integrated circuit (IC) devices or "chips," each of which performs one or more respective functions, such as, for example, processing, data storage, sensing, power management, etc. The various IC devices may be connected together by wiring (traces) on a printed circuit board (PCB). For many electronic devices, the peripheral chips (such as power management IC devices) are controlled by the microprocessor. The connection requirements for digital control range from simple (a single setting) to complex (multiple outputs with multiple set points). It is often desirable to minimize the number of interconnecting interfaces or wires between the controlling microprocessor and the peripheral chips in order to reduce PCB space and to save I/O pins on both the processor and the peripheral chips. Because microprocessors come in a variety of speeds and powers, single-wire interfaces between the microprocessor and the peripheral chips present restrictive timing requirements for control, which can be challenging to system designers.

Previously developed designs for control interfaces between a microprocessor and peripheral chips suffer from various drawbacks. For example, the control interfaces according to some previously developed designs may be relatively slow, require $2^N$ pulses to be sent for an N-bit control word, or have restrictive timing on minimum and/or maximum pulse widths. Some previously developed designs provide for single-wire control protocols, but these require fixed timing on the pulse widths, thereby placing constraints on host microcontroller processing speeds.

SUMMARY

According to an embodiment of the present invention, a method for a control interface includes: receiving a signal conveying bits of information over a single line; and for each bit of information, comparing the proportion of time that the signal on the single line is low versus the proportion of time that the signal on the single line is high for a respective bit period defined from one operative edge of the signal to the next operative edge of the signal in order to determine a logic value for that bit of information.

According to another embodiment of the present invention, a system is provided for a control interface. The system includes circuitry for receiving a signal conveying bits of information over a single line. Circuitry determines a logic value for each bit of information by comparing the proportion of time that the signal on the single line is low versus the proportion of time that the signal on the single line is high for a respective bit period defined from one operative edge of the signal to the next operative edge of the signal.

Important technical advantages of the present invention are readily apparent to one skilled in the art from the following figures, descriptions, and claims.

BRIEF DESCRIPTION OF DRAWINGS

For a more complete understanding of the present invention and for further features and advantages, reference is now made to the following description taken in conjunction with the accompanying drawings.

DETAILED DESCRIPTION

Embodiments of the present invention and their advantages are best understood by referring to FIGS. 1 through 4 of the drawings. Like numerals are used for like and corresponding parts of the various drawings.

In various embodiments, the present invention provides an interface and protocol between a control circuit (e.g., microprocessor, microcontroller, ASIC, or other suitable control circuit) and a peripheral circuit (e.g., memory chip, power management chip, or other suitable peripheral circuit). The control interface and protocol utilize a single line (e.g., wire, trace, or other suitable connector) over which control data is provided in a logic signal between the control circuit and the peripheral circuit. The state of the logic signal on the single wire is determined, for each bit of data, by the proportion of time that the signal on the line is low compared to the proportion of the time that the signal on the line is high, for example, for a period defined from one falling edge of the signal to the next falling edge. In another embodiment, the operative period can be defined from one rising edge of the signal to the next rising edge. The remainder of this description primarily describes embodiments using the falling edge of the signal to define the bit period. It should be understood, however, that the invention is not so limited; the operative edge of the signal (i.e., rising or falling) for defining the bit period is a matter of design choice.

As describe herein, embodiments of the present invention may provide numerous advantages or features. For example, various embodiments provide a single wire interface, with N+1 clock pulses (e.g., negative edges) for conveying a block of control information. Also, embodiments of the present invention are insensitive to timing variations (e.g., can run over a 50:1 frequency range), can be designed to run at high speed (e.g., greater than 1 MBit/sec) if desired, and may have a high signal to noise ratio. Various embodiments consume almost no power when in an idle state, and may offer very fast wake-up from the idle state. Furthermore, some embodiments can implement for bi-directional (read/write) communications on a single wire in a master/slave configuration.

Figure 1:
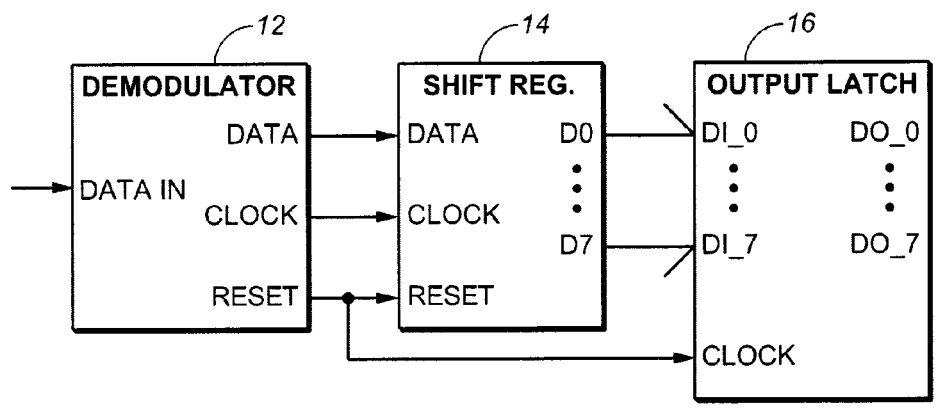
FIG. 1 is a block diagram of a single-wire control interface system, according to an embodiment of the invention.

FIG. 1 is a block diagram of a single-wire control interface system 10, according to an embodiment of the invention. Control interface system 10 may be incorporated in or used by a peripheral chip in an electronic device to interface with a microprocessor or microcontroller. In operation, control interface system 10 receives a control signal from the microcontroller over a single wire, for example, a trace on a printed circuit board (PCB). One type of peripheral chip in which control interface system 10 can be incorporated or used in a power management IC. Power management ICs are used in power converters to provide power for electronic devices. Among other capabilities, a power converter can adjust voltage level downward (buck converter) or adjust voltage level upward (boost converter). A power converter may also convert from alternating current (AC) power to direct current (DC) power, or vice versa. By way of example, the remainder of this description describes the control interface system 10 and protocol in the context of power management ICs, but the invention is not so limited. It should be understood that the control interface and protocol find broad application with any peripheral chip that interfaces with a microcontroller.

As shown, control interface system 10 includes a demodulator block 12, a shift register block 14, and an output latch block 16. Demodulator block 12 is coupled to a microcontroller by a single line or wire (e.g., a trace on a PCB) at an input terminal. As used herein, the terms "coupled" or "connected," or any variant thereof, covers any coupling or connection, either direct or indirect, between two or more elements. Demodulator block 12 receives a signal (DATA IN) from the microcontroller. The DATA IN signal is a modulated signal which carries or conveys information for controlling the power management IC or other peripheral chip in which control interface system 10 is incorporated or used. Modulation of the DATA IN signal can be performed by simple hardware or a software routine in the microcontroller. The demodulator block 12 demodulates the DATA IN signal, and outputs the control information in the form of a DATA signal. Demodulator block 12 also derives and outputs a CLOCK signal and a RESET signal in response to the DATA IN signal from the microcontroller. In one embodiment, the CLOCK signal is generated based on the falling (or leading) edges of the DATA IN signal; and the RESET signal is generated if the value of the DATA IN signal is HIGH (or LOW) for a relatively long time period.

Shift register block 14 is coupled to demodulator block 12 and receives the DATA, CLOCK, and RESET signals therefrom. Control information in the DATA signal is clocked into the shift register 14 with the CLOCK signal (which can be, for example, on the falling edge of DATA IN signal). Shift register block 14 stores and shifts the control information as it is received from the demodulator block 12. For shift register block 14 to receive and output N bits of control data only requires N+1 clock cycles. After N+1 pulses of the CLOCK signal (e.g., falling edges of the DATA IN signal), shift register block 14 transfers or outputs the entire block of N bits of control information to the output latch 16 in a plurality of signals, such as, signals D0 through D7. Although eight signals (e.g., D[0:7]) are illustrated, it should be understood that the present invention is not so limited; more or fewer signals can be used in other embodiments. Furthermore, shift register block 14 will be reset by the RESET signal if the DATA IN signal is a given state (HIGH or LOW) for a relatively long time period. The RESET signal powers down all active circuits on the power management IC. Shift register block 14 can be implemented with a shift register (e.g., comprising a plurality of flip-flops connected in series) and other circuitry, as one of ordinary skill in the art would understand based upon the description herein.

Output latch block 16 is coupled to shift register block 14 and receives the control signals D[0:7] in parallel as data in DI[0:7]. Output latch block 16 is also coupled to the demodulator block 12 and receives the RESET signal. Output latch block 16 outputs the control information in data out signals DO[0:7], with the RESET signal functioning as a CLOCK signal for the output latch block 16. The CLOCK signal for the output latch block 16 can alternately be generated by detecting the beginning of the STOP BIT, which is accomplished by counting the falling edges of the DATA line. The control information in data out signals DO[0:7] is provided to the power management IC or other peripheral chip for control of the same. This control information can be used to support or control various functions on the chip such as, for example, processing, data storage, sensing, power management, etc.

Control interface system 10 utilizes a protocol according to embodiments of the present invention. Any bit stream (e.g., data, control, or other information) can be communicated. In this protocol, implemented by demodulator block 12, each time or period (TBIT) over which a control bit is received is defined as the time between two falling edges of the DATA IN signal. During each bit time or period (TBIT), the value of the DATA IN signal will be high for some portion of the time THIGH and low for another portion of the time TLOW. For any given bit time or period (TBIT), the respective control bit will have logic 1 (HIGH) value if the DATA IN signal is high for longer than it is low during that TBIT. Conversely, respective control bit will have a logic 0 (LOW) value if the DATA IN signal is low for longer than it is high during the TBIT. In other words, if TLOW is greater than THIGH during a bit time (TBIT), the respective bit of control data has a LOW value; and if THIGH is greater than TLOW during a bit time (TBIT), the respective bit of control data has a HIGH value. Hence, embodiments of the invention are frequency independent in that they only depend on the ratio of the "HIGH" to "LOW" times (THIGH and TLOW) in the incoming DATA IN signal. This provides an advantage over some previously developed techniques which require a fixed pulse width (or time period) for a clock signal, thus putting timing restrictions on the microcontroller programming and clock frequencies.

Demodulator block 12 outputs the data for each control bit. The data for each control bit is clocked in to the first flip-flop in the shift register block 14 on the next falling edge of the DATA IN signal that follows its bit time. Furthermore, when the line (for the DATA IN signal) is idle for longer than a reset period (TRESET), the demodulator block 12 can be put into a low power state, awaiting the next falling edge of the DATA IN signal. This provides an advantage in prolonging battery life for an electronic device incorporating the control interface system 10.

In various embodiments, all or a portion of control interface system 10 can be implemented on a single or multiple semiconductor dies (commonly referred to as a "chip") or discrete components. Each die is a monolithic structure formed from, for example, silicon or other suitable material. For implementations using multiple dies or components, the dies and components can be assembled on a printed circuit board (PCB) having various traces for conveying signals therebetween. In one embodiment, for example, control interface system 10 are implemented on the same semiconductor die as the power management IC or peripheral chip supported by system 10.

In some embodiments, a separate control interface system 10 can be provided at the microcontroller sending control signals to the power management IC or peripheral chip. This allows bi-directional communication between the microcontroller and the peripheral chip. In such embodiments, the same or a separate control line (e.g., PCB trace) may be used for the second control interface system as for the first.

Figure 2:
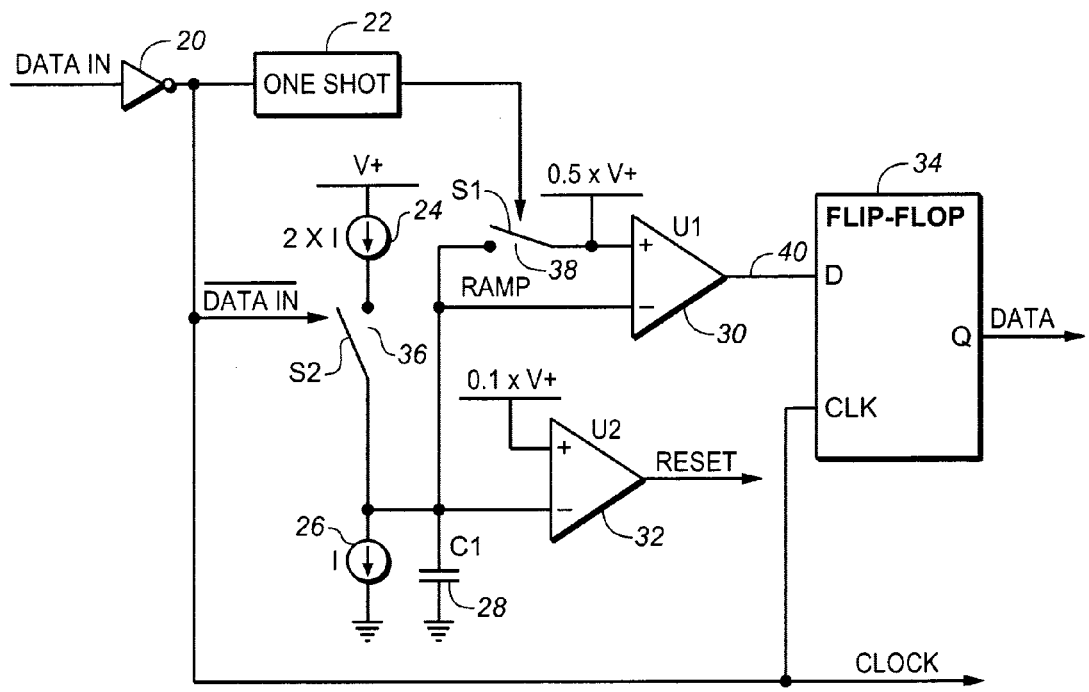
FIG. 2 is schematic diagram of an exemplary implementation for a demodulator block, according to an embodiment of the invention.

FIG. 2 is schematic diagram of an exemplary implementation for a demodulator block 12, according to an embodiment of the invention. As described herein, demodulator block 12 receives and demodulates a signal (DATA IN) from the microcontroller which carries or conveys control information for the power management IC or other peripheral chip. Demodulator block 12 implements a protocol for single-wire control. In this protocol, the logic state for each bit conveyed in the DATA IN signal is determined by the proportion of time that the value of the signal is low compared to the proportion of time that the value of the signal is high during a bit time or period (TBIT), which is defined from one falling edge of the DATA IN signal to the next falling edge of the DATA IN signal.

The implementation for demodulator block 12 shown in FIG. 2 is essentially analog. As depicted, in this implementation, demodulator block 12 comprises a logic inverter 20, a one-shot circuit 22, current sources 24, 26, capacitor 28, comparators 30, 32, and switches 36, 38. Logic inverter 20 receives the signal (DATA IN) from the microcontroller, and inverts it. Current source 26 is coupled to capacitor 28 at a RAMP node. Current source 26 provides a current (I). Current source 24 is coupled to supply voltage V+ and provides another current, the magnitude of which is greater than the magnitude of current output from current 26. For example, the current output by current source 24 can be twice that output from current source 26 (e.g., 2×I). Switch 36 is responsive to the output signal from logic inverter 20. When the value of the DATA IN signal is high, switch 36 is open, and current source 26 discharges capacitor 28 with current I. This cause the voltage at the RAMP node to decrease. When the value of the DATA IN signal is low, switch 36 is closed, which allows current source 24 to charge capacitor 28 with a net current of I (i.e., (2×I)−I). This causes the voltage at the RAMP node to increase.

The one-shot circuit 22, which is coupled to the logic inverter 20, outputs a short pulse ("one-shot") signal to close switch 38 on each falling edge of the DATA IN signal, thus resetting the voltage on capacitor 28 to mid-supply (0.5×V+). Comparator 30 has one input terminal (inverting) coupled to the RAMP node, and the other input terminal (non-inverting) coupled to a reference voltage having a value of one-half of the supply voltage (i.e., 0.5×V+). The output of comparator 30 is the output for demodulator block 12, and may comprise a signal 40 conveying the demodulated respective control bits for the bit time or periods (TBIT).

Also shown in FIG. 2 is a flip-flop 34, which can be the first flip-flop in shift register block 14 (FIG. 1). Flip-flop 34 can be implemented as a "D" flip-flop having an input (D) terminal, a clock (CLK) terminal, and an output (Q) terminal. Flip-flop 34 is coupled to receive the output from comparator 30 at the D input terminal, and the output from logic inverter 20 at the CLK terminal. Flip-flop 34 stores the output of comparator 30 at a falling edge of the DATA IN signal. The flip-flop 34 provides the stored value to the next flip-flop of shift register block 14 at its Q output terminal.

Comparator 32 has one input terminal (inverting) coupled to receive the RAMP signal, and the other input terminal (non-inverting) coupled to a reference voltage having a value of one-tenth of the supply voltage (i.e., 0.1×V+). Comparator 32 is used for resetting the demodulator block 12 when the line (DATA IN) has been high for some reset period (TRESET). When the DATA IN signal is high, switch 36 will be open, causing capacitor 28 to discharge. When capacitor 28 has discharged to a low voltage, (illustrated here by the reference voltage with value 0.1×V+), comparator 32 drives the RESET signal to a logic high.

In operation for demodulator block 12, the maximum bit time or period (TBIT) is defined by the maximum time the DATA IN signal can be high before triggering a RESET. In the extreme case, when TLOW is very short, this time is defined by the time required to discharge capacitor 28 from the reset voltage (e.g., 0.5×V+) to the reference voltage for comparator 32 (e.g., 0.1×V+). The bit time or period (TBIT) extends from one falling edge of the DATA IN signal to the next falling edge of the DATA IN signal. When the value of the DATA IN signal falls, one-shot circuit 22 causes switch 38 to close, thereby resetting the value at the RAMP node to mid-supply (e.g., 0.5×V+). This marks the beginning of the operative TBIT period. During the operative period, when the value of the DATA IN signal is LOW, switch 36 is closed, thus allowing current source 24 to charge capacitor 28 and the voltage at the RAMP node to rise. When DATA IN signal is HIGH, switch 36 is opened, thus allowing current source 26 to discharge capacitor 28; the voltage at the RAMP node decreases. At the next falling edge of the DATA IN signal, the operative bit time or period (TBIT) ends, and the output of comparator 30 is recorded in the flip-flop 34 (which is the first flip-flop of the shift register block 14).

If during the relevant bit time or period (TBIT), the DATA IN signal is low for longer than it is high, there will be a net positive charge on capacitor 28 and the voltage at the RAMP node will be higher than the reset voltage (i.e., 0.5×V+). This causes the output of comparator 30 to be HIGH, and thus a logic "0" will be clocked into the flip-flop 34 as data for the control bit. Conversely, if the DATA TN signal is high longer than it is low over the same period, then the voltage at the RAMP node will be lower than the reset voltage. This causes the output of comparator 30 to be LOW, and thus a logic "1" will be clocked into the flip-flop 34 as data for the control bit. Embodiments of the present invention thus offer the advantage of high noise margin detection of control data over a wide range of bit rates (clock frequencies), since they do not depend on or require any fixed periods for a clock signal.

In one embodiment, the data for each control bit is clocked in to the flip-flop 34 (in the shift register block 14) on the falling edge of the DATA signal that defines the end of the respective bit time or period (TBIT).

Furthermore, when the input line for demodulator block 12 is idle for longer than a certain period (TRESET), the demodulation block 12 can be put into a low power state, awaiting the next falling edge of the DATA IN signal. Specifically, in one embodiment, if the value of the DATA IN signal remains high for a sufficiently long time, capacitor 28 will discharge so that the voltage at the RAMP node is near 0V. When the RAMP node voltage crosses a threshold set near 0V (e.g., 0.1×V+), comparator 32 generates the RESET signal, which can used to de-bias all of the analog circuits to set the demodulator block 12 into a low power state. The RESET signal can be latched at output latch block 16.

The implementation for demodulator block 12 depicted in FIG. 2 is relatively simple and can be readily implemented on a power management IC or other peripheral chip.

Figure 3:
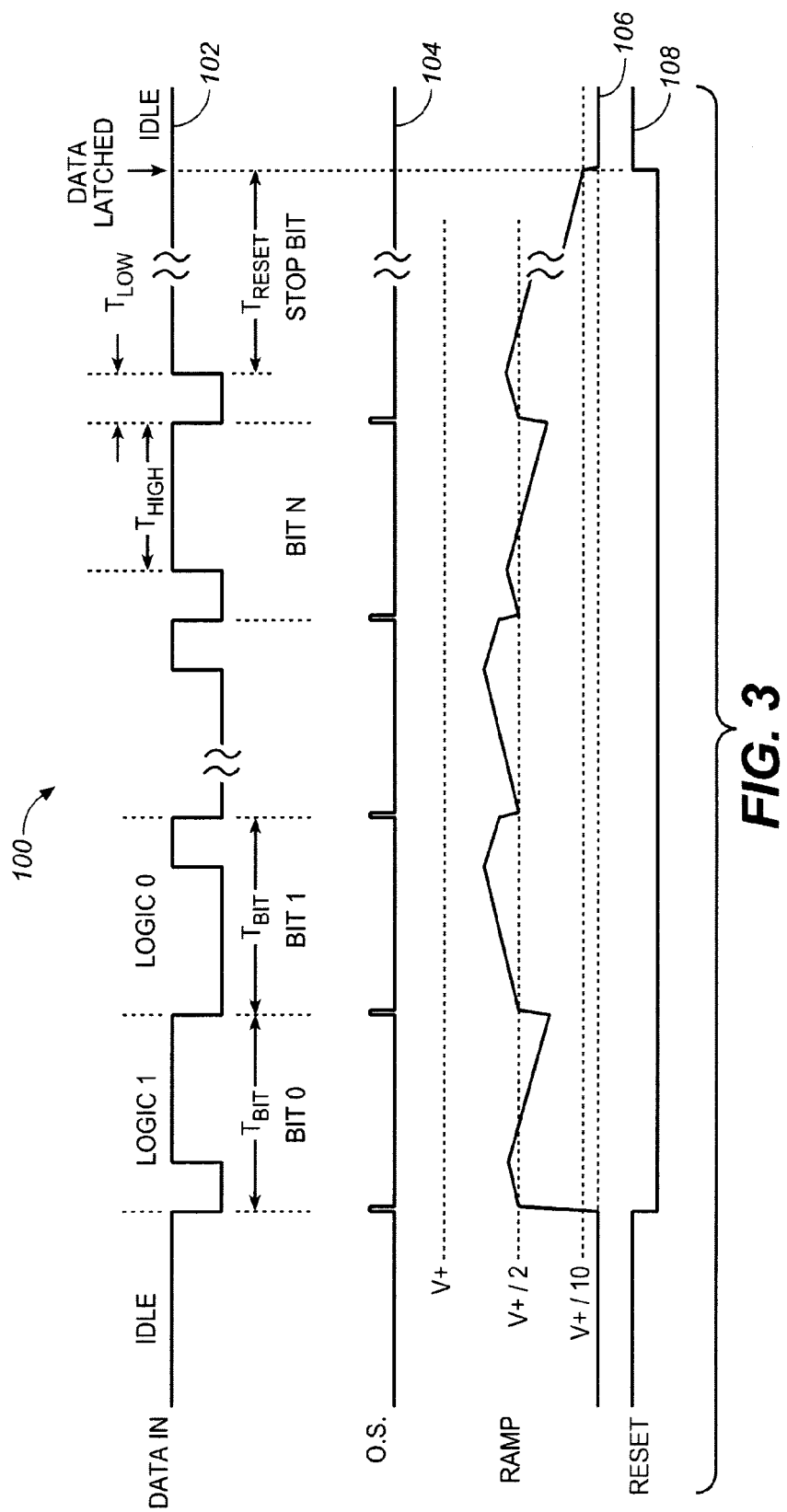
FIG. 3 is exemplary waveform diagram for a control protocol, according to an embodiment of the invention.

FIG. 3 is exemplary waveform diagram 100 for a control protocol, according to an embodiment of the invention. Waveform diagram 100 includes exemplary waveforms 102, 104, 106, and 108 which represent the value of the DATA IN signal, the value of the signal output from the one-shot circuit 22, the voltage at the RAMP node, and the value of the RESET signal, respectively, in the demodulator block 12 of FIG. 2.

The DATA IN signal (waveform 102) can alternately be in an idle state or conveying control data. In one embodiment, control data is conveyed in blocks, with each block having N control bits. Each bit of control data is provided in its own bit period or time (TBIT) in the DATA IN signal. Each bit time (TBIT) is defined as the period from one falling edge of the DATA IN signal to the next falling edge of the DATA IN signal. During each bit time or period (TBIT), the value of the DATA IN signal will be high for some portion of the time (THIGH) and low for another portion of the time (TLOW). A bit of control data has a value of Logic 1 when the DATA IN signal is HIGH for longer than it is low during the respective bit time or period (TBIT, or the time between negative clock edges). Conversely, a bit of control data have a value of Logic 0 when the DATA IN signal is LOW for longer than it is HIGH during the respective TBIT. Stated differently, if TLOW is greater than THIGH during a bit time (TBIT), the respective bit of control data has a LOW value; and if THIGH is greater than TLOW during a bit time (TBIT), the respective bit of control data has a HIGH value.

The signal output from the one-shot circuit 22 (waveform 104) comprises a number of short pulses, each of which is generated in response to a falling edge of the DATA IN signal. These pulses can be used to define the bit times (TBITs).

The voltage at the RAMP node (waveform 106) varies according to the charging and discharging of capacitor 28 due to current sources 24 and 26. When the DATA IN signal is high, switch 36 is open and current source 26 discharges capacitor 28, thus causing the voltage at the RAMP node to decrease. When the DATA IN signal is low, switch 36 is closed, thus allowing current source 24 to charge capacitor 28. This causes the voltage at the RAMP node to increase. The voltage at the RAMP node is reset to a reference level (e.g., one-half of supply voltage V+) during each one-shot pulse 104 (coinciding with the falling edges of the DATA IN signal).

The RESET signal (waveform 108) is generated when the voltage at the RAMP node falls below some predetermined value (e.g., near-zero, such as one-tenth of supply voltage V+), thus indicating that the DATA signal is in the idle state. The RESET signal can be used to place the demodulator block 12 into a low power state, thus increasing battery life for an electronic device incorporating the control interface system 10.

Figure 4:
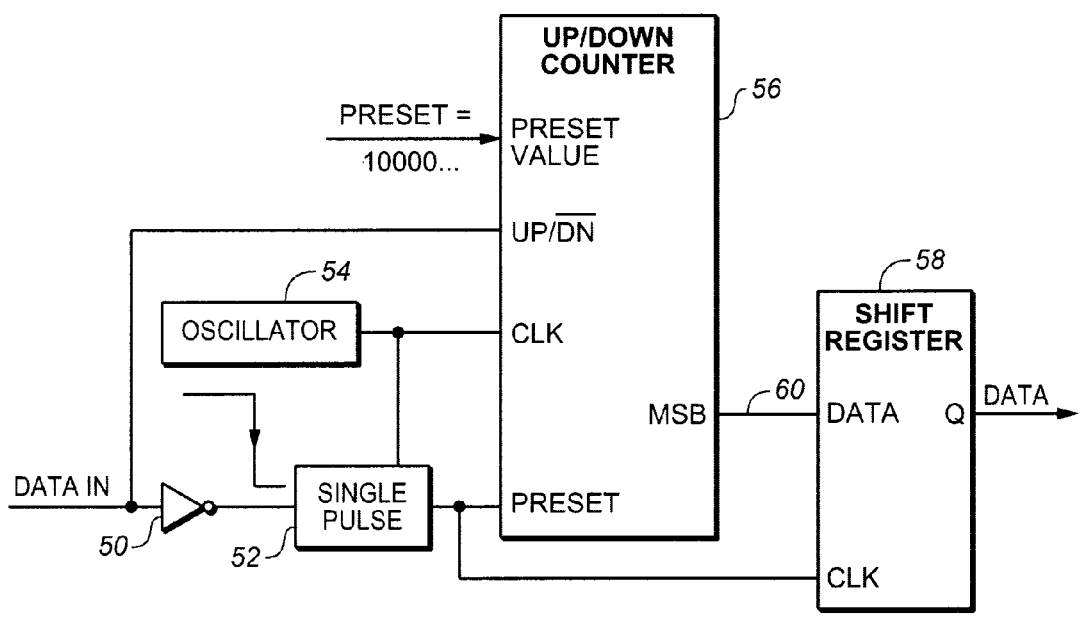
FIG. 4 is a block diagram of another exemplary implementation for a demodulator block, according to an embodiment of the invention.

FIG. 4 is a block diagram of another exemplary implementation for a demodulator block 12, according to an embodiment of the invention. As described herein, demodulator block 12 receives and demodulates a signal (DATA IN) from the microcontroller which carries or conveys control information for the power management IC or other peripheral chip.

Demodulator block 12 implements the protocol for single-wire control, wherein the logic state for each bit conveyed in the DATA IN signal is determined by the proportion of time that the value of the signal is low compared to the proportion of time that the value of the signal is high during a bit time or period (TBIT). Each bit time or period (TBIT) begins with a falling edge of the DATA IN signal, and ends with the next falling edge. During each bit time or period (TBIT), the value of the DATA IN signal will be high for some portion of the time THIGH and low for another portion of the time TLOW. For any given bit time or period (TBIT), if TLOW is greater than THIGH during a bit time (TBIT), the respective bit of control data has a LOW value; and if THIGH is greater than TLOW during a bit time (TBIT), the respective bit of control data has a HIGH value.

The implementation for demodulator block 12 in FIG. 4 is essentially digital. As depicted, in this implementation, demodulator block 12 comprises a logic inverter 50, a single-pulse circuit 52, an oscillator 54, and an up/down counter 56. Logic inverter 50 receives the signal (DATA IN) from the microcontroller, and inverts it. The output signal from logic inverter 50 is provided to single-pulse circuit 52. Oscillator 54 generates and outputs a clock (CLK) signal which is provided to up/down counter 56 and single-pulse circuit 52. Single-pulse circuit 52, which is clock-synchronized, outputs a pulse on the first clock cycle following each falling edge of the DATA IN signal. This pulse from single-pulse circuit 52 is used to preset the up/down counter 56.

The up/down counter 56 is used to detect whether the duty cycle of the DATA IN signal in a given bit time or period (TBIT) is greater than or less than 50%. If the duty cycle is greater than 50%, then the respective control bit has a HIGH value. Conversely, if the duty cycle is less than 50%, then the respective control bit has a LOW value. At the beginning of each TBIT (i.e., marked by the falling edge of DATA IN signal), the up/down counter 56 is preset (by the pulse from single-pulse circuit 52) to a predetermined value (e.g., 128, or binary 1000 0000). The up/down counter 56 counts up with each clock cycle (from oscillator 54) when the DATA IN signal is low, and counts down with each clock cycle when the DATA IN signal is high. If during the relevant bit time or period (TBIT), the DATA IN signal is low for longer than it is high, then the up/down counter 56 will have a count value that is higher than the preset value (129 through 255 decimal, or 1000 0001 through 1111 1111 binary). This causes the counter to output a logic "1" as data for the respective control bit. Conversely, if the DATA IN signal is high longer than it is low over the same period, then the up/down counter 56 will have a count value that is lower than the preset value (e.g., 0 to 127 decimal, or 0000 0000 through 0111 1111 binary). This causes the counter to output a logic "0" as data for the respective control bit. As can be seen from the counter's binary values above, the most significant bit (MSB) of the binary counter serves to indicate if the counter has counted to higher or lower than the midpoint. In one embodiment, up/down counter 56 can be implemented with, for example, a 8-bit up/down counter.

A RESET signal similar to that illustrated by waveform 108 in FIG. 3 can be generated from up/down counter 56 with simple digital logic (not shown) by detecting when the up/down counter 56 has reached either 0 or its full scale value. When either limit of the up/down counter is reached, the oscillator 54 can be turned off to save power until DATA IN signal changes state.

In one embodiment, the preset value, can be the midway point for the highest value for the up/down counter 56. For example, for an 8-bit counter, the preset value could be "1000 0000", which is midway between the lowest value "0000 0000" and the highest value "1111 1111." A net increase in the count during any given bit time or period (TBIT) will not change the value of the most significant bit (MSB) of the preset value (i.e., "1"). However, a net decrease in the count during any given bit time or period (TBIT) will change the value of the MSB of the preset value from "1" to "0". Thus, it is possible to use the MSB of the up/down counter 56 as an indicator of the value of the control bit. The MSB signal 60 output from the up/down counter 56 conveys the demodulated respective control bits for the bit time or periods (TBIT).

The number of bits in the up/down counter 56 determines the range of minimum TBIT to maximum TBIT that the demodulator block 12 will tolerate. In one embodiment, for example, the minimum TBIT time is 4 clock cycles of oscillator 54, and the maximum TBIT time is $2^N$ clock cycles of oscillator 54 (where N is the number of bits in the up-down counter 56).

Also shown in FIG. 4 is a shift register 58, which can be the first flip-flop in shift register block 14 (FIG. 1). Shift register 58 can be implemented as a "D" flip-flop having an input (D) terminal, a clock (CLK) terminal, and an output (Q) terminal. Shift register 58 is coupled to receive the output from up/down counter 56 at the D input terminal. In one embodiment, as shown, shift register 58 receives the output from single pulse circuit 52 at the CLK terminal, and thus stores the output of up/down counter 56 in response to the pulse from single pulse circuit 52. In another embodiment, shift register 58 may receive the output from logic inverter 50 at the CLK terminal. The shift register 58 provides the stored value to the next flip-flop of shift register block 14 at its Q output terminal.

As described herein, in various embodiments, the present invention utilizes a communications protocol using a single wire to transmit digital data. The protocol features robust and simple demodulation. Modulation can be performed by simple hardware, or in a microcontroller software routine; The protocol works over a very wide frequency range. Embodiments of the invention can be used for, but are not limited to, digital control of power management circuits. Furthermore, according to embodiments of the invention, a protocol is provided for single wire control, whereby a the state of the logic signal is determined by the proportion of the bit time that the data line is low compared to the proportion of the bit time that the data line is high.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A method for a control interface comprising:
   receiving a signal conveying bits of information over a single line; and
   for each bit of information, comparing the proportion of time that the signal on the single line is low versus the proportion of time that the signal on the single line is high for a respective bit period defined from one operative edge of the signal to the next operative edge of the signal in order to determine a logic value for that bit of information.

2. The method of claim 1, wherein the operative edges of the signal are falling edges.

3. The method of claim 1, wherein the operative edges of the signal are rising edges.

4. The method of claim 1, wherein comparing comprises:
   charging a capacitor when the signal on the single line is high during each respective bit period defined from one operative edge of the signal to the next operative edge of the signal; and
   discharging the capacitor when the signal on the single line is low during each respective bit period defined from one operative edge of the signal to the next operative edge of the signal.

5. The method of claim 4, comprising comparing a voltage on the capacitor to a reference voltage at the end of each respective bit period defined from one operative edge of the signal to the next operative edge of the signal.

6. The method of claim 4, wherein:
   the logic value for a bit of information is HIGH if a voltage on the capacitor is above a reference voltage at an end of the respective bit period defined from one operative edge of the signal to the next operative edge of the signal; and
   the logic value for the bit of information is LOW if the voltage on the capacitor is below the reference voltage at the end of the respective bit period defined from one operative edge of the signal to the next operative edge of the signal.

7. The method of claim 4, comprising resetting a voltage on the capacitor to a predetermined value at the end of each respective bit period defined from one operative edge of the signal to the next operative edge of the signal.

8. The method of claim 1, wherein comparing comprises:
   incrementing a counter when the signal on the single line is high during the respective bit period defined from one operative edge of the signal to the next operative edge of the signal; and
   decrementing the counter when the signal on the single line is low during the respective bit period defined from one operative edge of the signal to the next operative edge of the signal.

9. The method of claim 8, wherein:
   the logic value for a bit of information is HIGH if a count value of the counter is lower than a preset value at an end of the respective bit period defined from one operative edge of the signal to the next operative edge of the signal; and
   the logic value for the bit of information is LOW if the count value of the counter is higher than a preset value at the end of the respective bit period defined from one operative edge of the signal to the next operative edge of the signal.

10. The method of claim 8, comprising resetting the counter to a predetermined value at the end of each respective bit period defined from one operative edge of the signal to the next operative edge of the signal.

11. The method of claim 1, comprising storing each bit of information in a shift register after its logic value has been determined.

12. The method of claim 11, comprising shifting a plurality of stored bits of information out of the shift register in parallel.

13. The method of claim 1 wherein the bits of information provide control for one of processing, data storage, sensing, or power management functions.

14. A system for a control interface comprising:
   circuitry for receiving a signal conveying bits of information over a single line; and
   circuitry for determining a logic value for each bit of information by comparing the proportion of time that the signal on the single line is low versus the proportion of time that the signal on the single line is high for a respective bit period defined from one operative edge of the signal to the next operative edge of the signal.

15. The system of claim 14, wherein the operative edges of the signal are falling edges.

16. The system of claim 14, wherein the operative edges of the signal are rising edges.

17. The system of claim 14, wherein the circuitry for determining a logic value for each bit of information comprises:
   a capacitor operable to be charged when the signal on the single line is high during each respective bit period defined from one operative edge of the signal to the next operative edge of the signal, the capacitor operable to be discharged when the signal on the single line is low during each respective bit period defined from one operative edge of the signal to the next operative edge of the signal; and
   a comparator coupled to the capacitor and operable to compare a voltage on the capacitor to a reference voltage at the end of each respective bit period defined from one operative edge of the signal to the next operative edge of the signal.

18. The system of claim 17, wherein:
the logic value for a bit of information is HIGH if a voltage on the capacitor is above a reference voltage at an end of the respective bit period defined from one operative edge of the signal to the next operative edge of the signal; and
the logic value for the bit of information is LOW if the voltage on the capacitor is below the reference voltage at the end of the respective bit period defined from one operative edge of the signal to the next operative edge of the signal.

19. The system of claim 17, comprising:
a first current source operable to charge the capacitor when the signal on the single line is high during each respective bit period defined from one operative edge of the signal to the next operative edge of the signal; and
a second current source operable to discharge the capacitor when the signal on the single line is low during each respective bit period defined from one operative edge of the signal to the next operative edge of the signal.

20. The system of claim 17, wherein a voltage on the capacitor is reset to a predetermined value at the end of each respective bit period defined from one operative edge of the signal to the next operative edge of the signal.

21. The system of claim 14, wherein the circuitry for determining a logic value for each bit of information comprises a counter operable to be incremented when the signal on the single line is high during the respective bit period defined from one operative edge of the signal to the next operative edge of the signal, the counter operable to be decremented when the signal on the single line is low during the respective bit period defined from one operative edge of the signal to the next operative edge of the signal.

22. The system of claim 21, wherein the circuitry for determining a logic value for each bit of information comprises an oscillator operable to provide a clock signal to the counter.

23. The system of claim 21, wherein:
the logic value for a bit of information is HIGH if a count value of the counter is lower than a preset value at an end of the respective bit period defined from one operative edge of the signal to the next operative edge of the signal; and
the logic value for the bit of information is LOW if the count value of the counter is lower than the preset value at the end of the respective bit period defined from one operative edge of the signal to the next operative edge of the signal.

24. The system of claim 21, wherein the counter is reset to a predetermined value at the end of each respective bit period defined from one operative edge of the signal to the next operative edge of the signal.

25. The system of claim 14, comprising a shift register operable to store each bit of information after its logic value has been determined.

26. The system of claim 25, wherein a plurality of stored bits of information are shifted out of the shift register in parallel.

27. The system of claim 14 wherein the bits of information provide control for one of processing, data storage, sensing, or power management functions.

28. A system for a control interface comprising:
means for receiving a signal conveying bits of information over a single line; and
means for determining a logic value for each bit of information by comparing the proportion of time that the signal on the single line is low versus the proportion of time that the signal on the single line is high for a respective bit period defined from one operative edge of the signal to the next operative edge of the signal.

29. The system of claim 28, wherein the operative edges of the signal are falling edges.

30. The system of claim 28, wherein the operative edges of the signal are rising edges.

31. The system of claim 28, wherein the means for determining a logic value for each bit of information comprises:
a capacitor operable to be charged when the signal on the single line is high during each respective bit period defined from one operative edge of the signal to the next operative edge of the signal, the capacitor operable to be discharged when the signal on the single line is low during each respective bit period defined from one operative edge of the signal to the next operative edge of the signal; and
a comparator coupled to the capacitor and operable to compare a voltage on the capacitor to a reference voltage at the end of each respective bit period defined from one operative edge of the signal to the next operative edge of the signal.

32. The system of claim 28, wherein the means for determining a logic value for each bit of information comprises a counter operable to be incremented when the signal on the single line is high during the respective bit period defined from one operative edge of the signal to the next operative edge of the signal, the counter operable to be decremented when the signal on the single line is low during the respective bit period defined from one operative edge of the signal to the next operative edge of the signal.

33. The system of claim 28 wherein the bits of information provide control for one of processing, data storage, sensing, or power management functions.

34. A system comprising:
a control circuit operable to output bits of control information in a single-line protocol;
a single line operable to carry a signal conveying the bits of control, wherein in the single-line protocol a logic value for each bit of control information can be determined by comparing the proportion of time that the signal on the single line is low versus the proportion of time that the signal on the single line is high for a respective bit period defined from one operative edge of the signal to the next operative edge of the signal; and
a peripheral circuit coupled to receive the signal from the control circuit over the single line, the peripheral circuit operable to demodulate the signal to obtain the bits of control information, wherein the bits of control information are used to control the peripheral circuit.

35. The system of claim 34, wherein the peripheral circuit comprises:
a capacitor operable to be charged when the signal on the single line is high during each respective bit period defined from one operative edge of the signal to the next operative edge of the signal, the capacitor operable to be discharged when the signal on the single line is low during each respective bit period defined from one operative edge of the signal to the next operative edge of the signal; and
a comparator coupled to the capacitor and operable to compare a voltage on the capacitor to a reference voltage at the end of each respective bit period defined from one operative edge of the signal to the next operative edge of the signal.

36. The system of claim 34, wherein the peripheral circuit comprises a counter operable to be incremented when the signal on the single line is high during the respective bit period defined from one operative edge of the signal to the next operative edge of the signal, the counter operable to be decremented when the signal on the single line is low during the respective bit period defined from one operative edge of the signal to the next operative edge of the signal.

37. The system of claim 34, wherein the peripheral circuit comprises a power management integrated circuit device.

* * * * *